(12) United States Patent
Hsu et al.

(10) Patent No.: US 12,075,585 B2
(45) Date of Patent: Aug. 27, 2024

(54) ELECTRONIC DEVICE AND METHOD OF ASSEMBLING THE SAME

(71) Applicant: GETAC TECHNOLOGY CORPORATION, New Taipei (TW)

(72) Inventors: Wan-Lin Hsu, Taipei (TW); Juei-Chi Chang, Taipei (TW); Hsin-Chih Chou, Taipei (TW)

(73) Assignee: GETAC Technology Corporation (TW)

( * ) Notice: Subject to any disclaimer, the term of this patent is extended or adjusted under 35 U.S.C. 154(b) by 0 days.

(21) Appl. No.: 17/883,479

(22) Filed: Aug. 8, 2022

(65) Prior Publication Data
US 2023/0038904 A1    Feb. 9, 2023

Related U.S. Application Data

(60) Provisional application No. 63/231,196, filed on Aug. 9, 2021.

(51) Int. Cl.
*H05K 5/06* (2006.01)
*H05K 5/00* (2006.01)
(Continued)

(52) U.S. Cl.
CPC ........... *H05K 5/062* (2013.01); *H05K 5/0004* (2013.01); *H05K 5/0221* (2013.01); *H05K 5/023* (2013.01); *H05K 5/03* (2013.01)

(58) Field of Classification Search
CPC .... H05K 5/062; H05K 5/0004; H05K 5/0221; H05K 5/023; H05K 5/03; H05K 5/061;
(Continued)

(56) References Cited

U.S. PATENT DOCUMENTS

| 8,764,073 B2* | 7/2014 | Lin | ......................... G06F 1/1658 |
| | | | 277/637 |
| 9,317,077 B2* | 4/2016 | Mori | ...................... G06F 1/1616 |

(Continued)

FOREIGN PATENT DOCUMENTS

| CN | 1479187 A | 3/2004 |
| CN | 104582346 A | 4/2015 |

(Continued)

OTHER PUBLICATIONS

European Patent Office, Search Report, Application No. 22189284.7, May 1, 2023, Germany.

*Primary Examiner* — Sagar Shrestha
(74) *Attorney, Agent, or Firm* — Andy M. Han; Han IP PLLC

(57) ABSTRACT

An electronic device includes a casing and a waterproof lid structure. The casing has an opening. The waterproof lid structure corresponds in position to the opening and includes a supportive sheet metal, waterproof component, movable latch lid and bolts. The supportive sheet metal has an axle pivotally connected to one side of the opening. The waterproof component hermetically seals the opening and lies on one side of the supportive sheet metal. The movable latch lid covers the other side of the supportive sheet metal and is penetrated by passages. The bolts correspond in position to the passages, respectively, and each include a rod portion and a head portion disposed at one end of the rod portion. The rod portions pass through the passages and supportive sheet metal to get fastened to the waterproof component, allowing the head portions to stop at the outer side of the movable latch lid.

16 Claims, 6 Drawing Sheets

(51) Int. Cl.
*H05K 5/02* (2006.01)
*H05K 5/03* (2006.01)

(58) Field of Classification Search
CPC . G06F 1/1656; H01M 50/244; H01M 50/271; H01M 50/24
See application file for complete search history.

(56) References Cited

U.S. PATENT DOCUMENTS

| | | | | |
|---|---|---|---|---|
| 9,390,746 | B2* | 7/2016 | Lee | G06F 1/1656 |
| 9,560,782 | B2* | 1/2017 | Lee | H05K 5/068 |
| 9,668,370 | B1* | 5/2017 | Huang | H05K 5/0217 |
| 9,830,953 | B1* | 11/2017 | Chen | G11B 17/043 |
| 10,050,374 | B1* | 8/2018 | Lee | G06F 1/1656 |
| 10,743,431 | B2* | 8/2020 | Shindo | G06F 1/1656 |
| 2006/0007647 | A1* | 1/2006 | Peng | G06F 1/1616 |
| | | | | 361/679.55 |
| 2008/0187407 | A1* | 8/2008 | Tien | F16B 5/02 |
| | | | | 411/107 |
| 2008/0291641 | A1* | 11/2008 | Sheng | G06F 1/1658 |
| | | | | 361/726 |
| 2009/0109635 | A1* | 4/2009 | Chen | G06F 1/1656 |
| | | | | 361/728 |
| 2009/0219676 | A1* | 9/2009 | Murakata | H01M 50/262 |
| | | | | 361/679.01 |
| 2010/0297485 | A1* | 11/2010 | Ren | H01M 50/209 |
| | | | | 429/100 |
| 2014/0368994 | A1* | 12/2014 | Lee | H05K 5/061 |
| | | | | 361/679.55 |
| 2015/0047262 | A1* | 2/2015 | Lee | H05K 5/061 |
| | | | | 49/477.1 |
| 2017/0340078 | A1 | 11/2017 | Huang | |
| 2019/0179214 | A1* | 6/2019 | Hara | H05K 5/03 |
| 2020/0337164 | A1* | 10/2020 | Lee | H05K 5/03 |
| 2021/0405144 | A1* | 12/2021 | Lee | G01S 3/38 |
| 2022/0091638 | A1* | 3/2022 | Lee | G06F 1/1684 |

FOREIGN PATENT DOCUMENTS

| | | |
|---|---|---|
| CN | 107317090 A | 11/2017 |
| CN | 107426933 A | 12/2017 |
| CN | 207932170 U | 10/2018 |
| CN | 109698289 A | 4/2019 |
| CN | 209556141 U | 10/2019 |
| CN | 110764569 A | 2/2020 |
| CN | 211826991 U | 10/2020 |
| CN | 112153843 A | 12/2020 |
| CN | 212515158 U | 2/2021 |
| CN | 112558707 A | 3/2021 |
| KR | 20170003851 U | 11/2017 |

\* cited by examiner

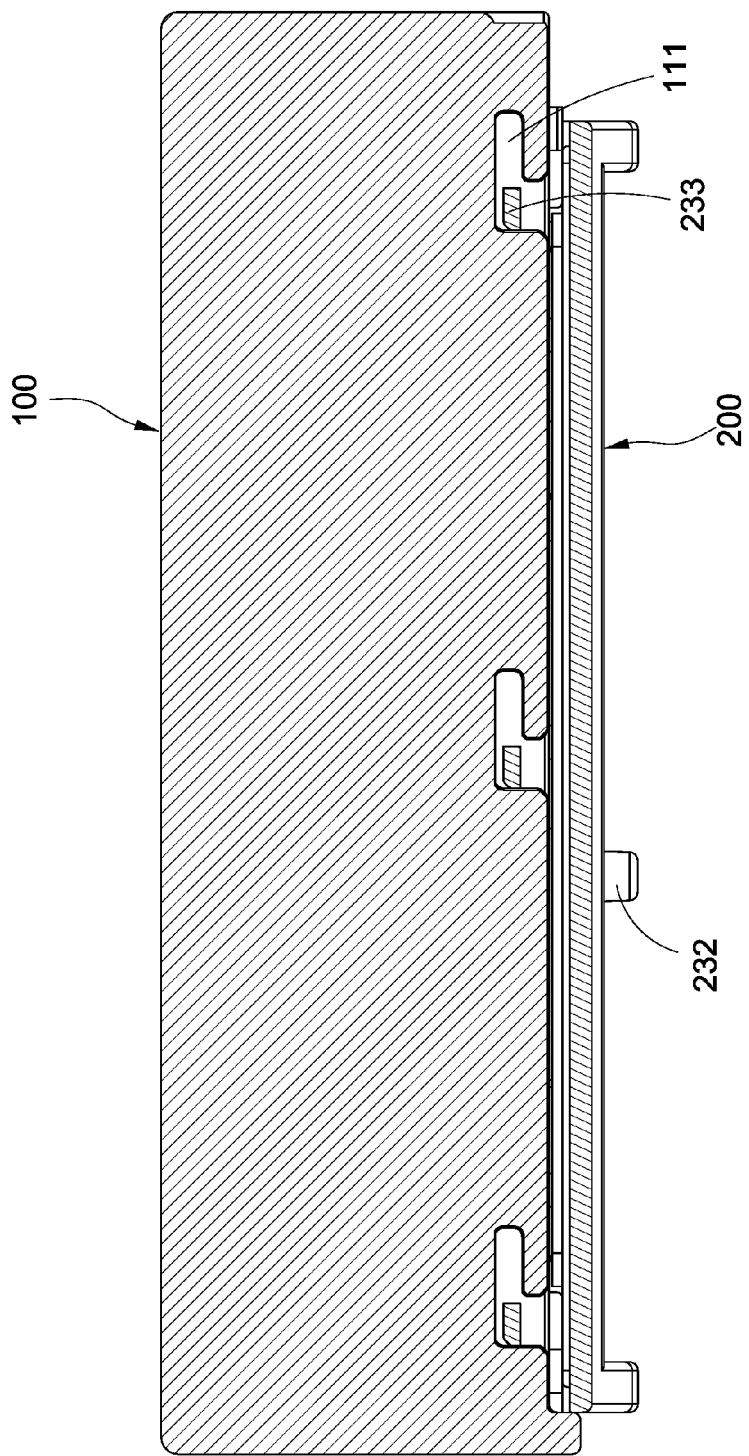

ELECTRONIC DEVICE AND METHOD OF ASSEMBLING THE SAME

CROSS-REFERENCE TO RELATED APPLICATIONS

The present application claims the benefit of U.S. Provisional Patent Application No. 63/231,196, filed on Aug. 9, 2021, the disclosure of which is hereby incorporated by reference herein in its entirety.

BACKGROUND OF THE INVENTION

Field of the Invention

The present disclosure relates to electronic devices and, more particularly, to an electronic device comprising a waterproof lid structure which is structurally simple and highly durable.

Description of the Prior Art

Some electronic devices, such as laptops and workstations, come with waterproof lids mounted on openings of receiving chambers for receiving batteries. The receiving chambers are hermetically sealed with soft waterproof elements of the waterproof lids, so as to preclude intrusion of moisture or dust into the receiving chambers. It is because the intrusion of moisture or dust is likely to cause a battery failure or a shortened service life. Furthermore, the waterproof lid is pivotally connected to one side of the opening, and the waterproof lid is fixed to the opening by snap-engagement when shut, so as to prevent the waterproof lid from breaking off when opened or from detaching when shaken or hit.

However, owing to technological advancement, the axles (for pivotal connection) and snap-engagement components (for snap-engagement) of the conventional waterproof lids are made of plastic and manufactured by injection molding with a view to rendering the electronic devices lightweight and easy to manufacture, at the expense of durability. Low durability results from resilience fatigue and deformation after long use. Moreover, regarding a conventional waterproof lid, not only are a waterproof element and a casing have to be fixed to each other, but the casing also has to be snap-engaged with the opening, thereby adding to the complexity of the entire framework and causing a plethora of parts and components. Therefore, it is important to increase the structural strength of the waterproof lid to enhance durability, and simplify the structure of the waterproof lid, with a view to rendering the parts and components easy to manufacture and cutting cost.

In view of this, the inventor of the present disclosure aims to improve the prior art by overcoming the aforesaid drawbacks of the prior art.

SUMMARY OF THE INVENTION

It is an objective of the present disclosure to simplify a waterproof lid structure of an electronic device and increase its mechanical strength to thereby enhance its durability and its waterproofing and dustproofing efficiency.

In order to achieve the above and other objectives, the present disclosure provides an electronic device comprising a casing and a waterproof lid structure. The casing has an opening. The waterproof lid structure corresponds in position to the opening. The waterproof lid structure comprises a supportive sheet metal, a waterproof component, a movable latch lid and a plurality of bolts. The supportive sheet metal has an axle. The axle is pivotally connected to one side of the opening. The waterproof component is adapted to hermetically seal the opening and is disposed on one side of the supportive sheet metal. The movable latch lid covers the other side of the supportive sheet metal and is penetrated by a plurality of passages. The bolts correspond in position to the passages, respectively. The bolts each comprise a rod portion and a head portion disposed at one end of the rod portion. The rod portions pass through the passages and supportive sheet metal, respectively. The other ends of the rod portions are fastened to the waterproof component. The head portions stop at the outer side of the movable latch lid.

In order to achieve the above and other objectives, the present disclosure further provides a method of assembling an electronic device. The method comprises the steps of: providing a casing, a supportive sheet metal, a waterproof component, a movable latch lid and a plurality of bolts, the casing having an opening, the supportive sheet metal having an axle, the movable latch lid being penetrated by a plurality of passages, the bolts corresponding in position to the passages, respectively, the bolts each comprising a rod portion and a head portion disposed at one end of the rod portion; positioning the waterproof component on a side of the supportive sheet metal and covering another side of the supportive sheet metal with the movable latch lid; passing the rod portions of the bolts from an outer side of the movable latch lid through the passages, respectively, and through the supportive sheet metal before being fastened to the waterproof component, thereby allowing the head portion to stop at the outer side of the movable latch lid; and connecting pivotally the axle of the supportive sheet metal to a side of the opening, wherein the waterproof component covers and hermetically seals the opening.

In order to achieve the above and other objectives, the present disclosure further provides an electronic device comprising a casing and a waterproof lid structure. The casing has an opening. The waterproof lid structure corresponds in position to the opening. The waterproof lid structure comprises a base, a waterproof component, a movable latch lid and a coupling element. The base is penetrated by a through hole and pivotally disposed on a side of the opening. The waterproof component is disposed on a side of the base to hermetically seal the opening. The movable latch lid is penetrated by a passage and disposed on another side of the base. The coupling element comprises a rod portion and a head portion disposed at one end of the rod portion. The rod portion passes through the passage and then passes through the through hole. The head portion stops at an outer side of the passage. The other end of the rod portion is fixed to the waterproof component, and the movable latch lid slides along the rod portion through the passage.

In order to achieve the above and other objectives, the present disclosure further provides a method of assembling an electronic device. The method comprises the steps of: providing a casing, a base, a waterproof component, a movable latch lid and a coupling element, the casing having an opening, the base being penetrated by a through hole, the movable latch lid being penetrated by a passage, and the coupling element comprising a rod portion and a head portion disposed at one end of the rod portion; positioning the waterproof component on a side of the base and positioning the movable latch lid on another side of the base; passing the rod portion through the passage and then through the through hole, allowing the head portion to stop at an outer side of the passage, allowing the other end of the rod portion to be fixed to the waterproof component, allowing the movable latch lid to slide along the rod portion through the passage; and connecting pivotally the base to a side of the opening.

The present disclosure further has advantages described below. With the positioning posts being penetratingly disposed at the through holes, not only are the supportive sheet metal and the waterproof component positioned by each other, they are also fastened together by the bolts to fix the movable latch lid and the waterproof component to each other. The length of extension of the passage places limitations on the displacement of the movable latch lid. By moving the movable latch lid, it is feasible for the latch portion to be latched into or removed from a fastening groove, such that the waterproof lid structure gets fastened or released. Furthermore, with the resilient hook being engagingly fitted to the left and right sides of the dowel, users can confirm whether the movable latch lid has been moved to a fastening position or a release position.

BRIEF DESCRIPTION OF THE DRAWINGS

FIG. 6 is a cross-sectional top view taken along line 6-6 of FIG. 5.

DETAILED DESCRIPTION OF THE EMBODIMENTS

The technical features of the present disclosure are depicted by accompanying drawings and described below. However, the accompanying drawings are illustrative rather than restrictive of the present disclosure.

Figure 1:
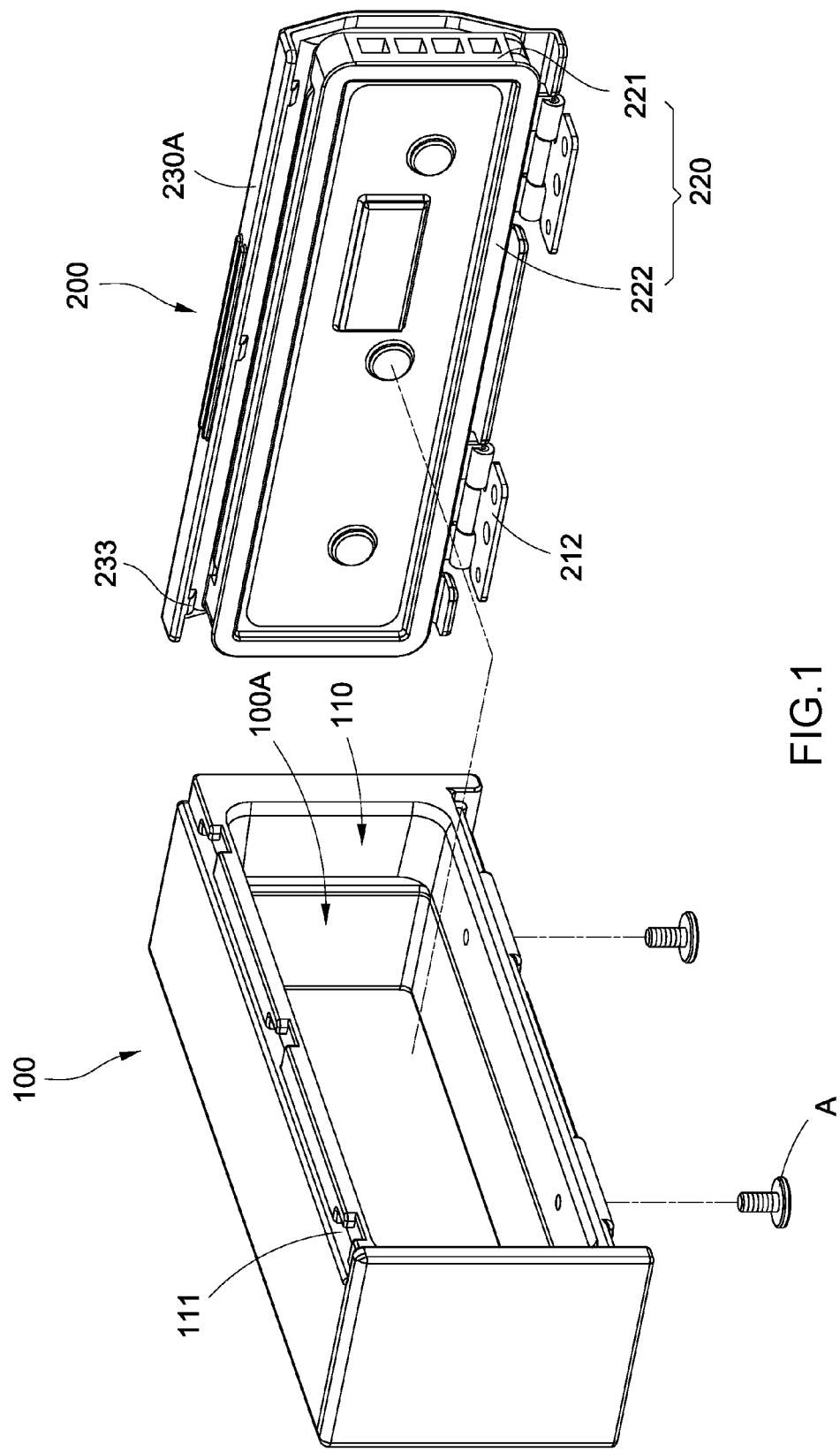
FIG. 1 is an exploded view of the present disclosure.
Figure 2:
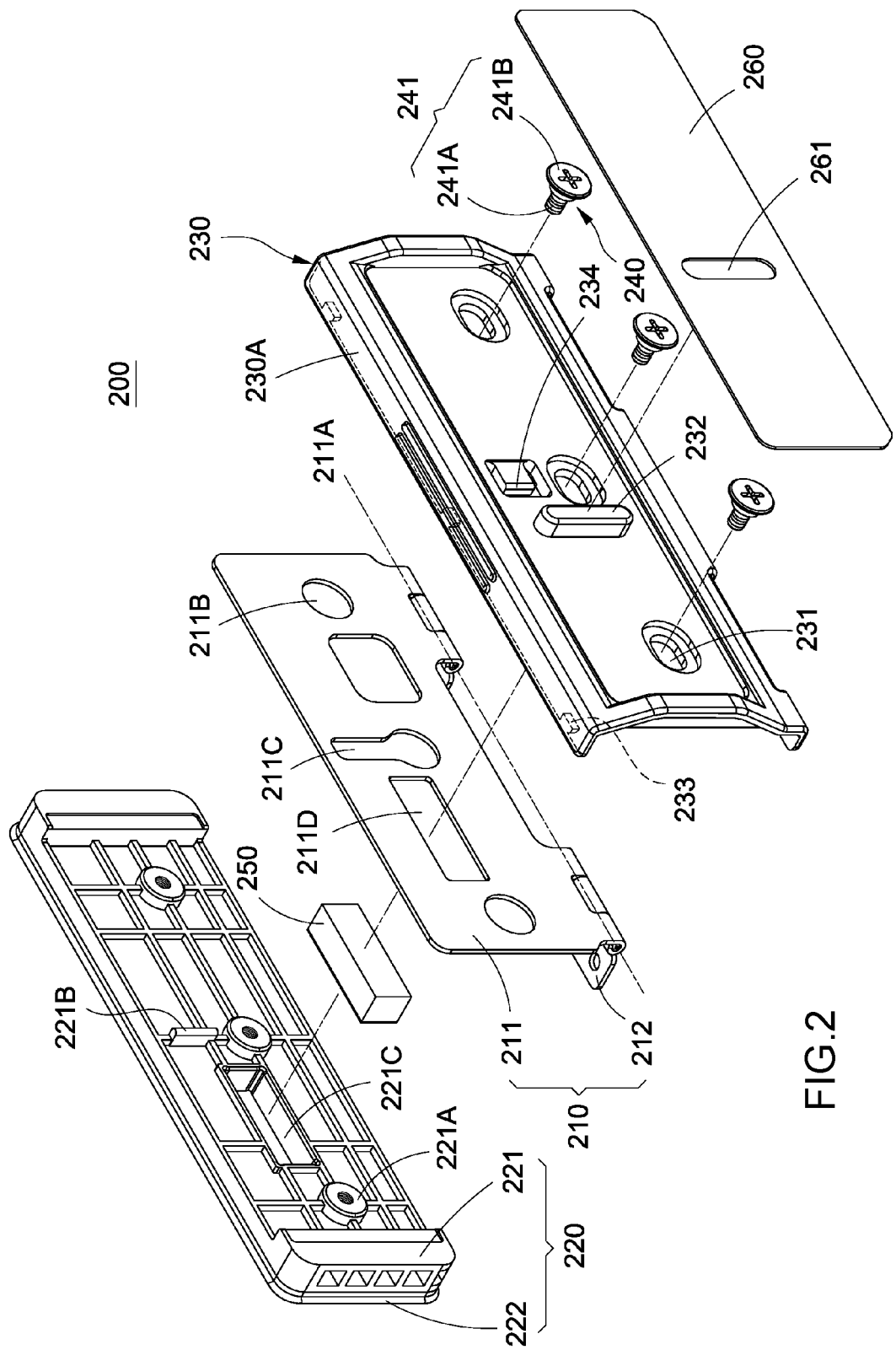
FIG. 2 is an exploded view of a waterproof lid structure of the present disclosure.

The present disclosure provides an electronic device. Referring to FIG. 1 and FIG. 2, the electronic device essentially comprises a casing 100 and a waterproof lid structure 200.

In this embodiment, the casing 100 is made of aluminum or plastic, but the present disclosure is not limited thereto. The casing 100 has a chamber 100A for receiving a battery (not shown). The casing 100 has an opening 110 in communication with the chamber 100A. In this embodiment, the opening 110 is oblong. The accompanying drawings show the opening 110 and its surroundings rather than the whole of the casing 100 for the sake of illustration, and the other parts of the casing 100 are not restrictive of the present disclosure.

The waterproof lid structure 200 corresponds in position to the opening 110 and looks like a door substantially. The waterproof lid structure 200 essentially comprises a supportive sheet metal 211, a waterproof component 220, a movable latch lid 230 and a plurality of bolts 241.

The supportive sheet metal 211 corresponds in shape to the opening 110 and thus is an oblong sheet metal plate made of stainless steel, but the present disclosure is not limited thereto. For example, the supportive sheet metal 211 may also be provided in the form of any other metal plate of high mechanical strength. The supportive sheet metal 211 has an axle 211A. The axle 211A is pivotally connected to one side of the opening 110. The supportive sheet metal 211 is penetrated by a plurality of through holes 211B. The through holes 211B are equidistantly disposed along the longitudinal direction of the supportive sheet metal 211. In this embodiment, the axle 211A of the supportive sheet metal 211 is further connected to two securing sheet metals 212. The securing sheet metals 212 are fixed to one side of the opening 110 through two screwing elements A to allow the supportive sheet metal 211 to turn over relative to the securing sheet metals 212 through the axle 211A.

The waterproof component 220 corresponds in shape to the supportive sheet metal 211 and thus is oblong. In this embodiment, the waterproof component 220 comprises a joint portion 221 and a seal portion 222 which are connected. The joint portion 221 is made of hard plastic, whereas the seal portion 222 is made of soft plastic (for example, silica gel or rubber), and both are coupled together by bi-injection to manufacture the waterproof component 220. The joint portion 221 is disposed on one side of the supportive sheet metal 211 and corresponds in position to the opening 110. The seal portion 222 hermetically seals the opening 110. Therefore, the soft seal portion 222 hermetically seals the opening 110 effectively by resilient deformation to thereby attain a minimum waterproof and dustproof rating of IP66. The tolerance of the joint portion 221 made of plastic is effectively controlled during a production process to enable the joint portion 221 to snap-engage with the supportive sheet metal 211. A plurality of positioning posts 221A are protrudingly disposed at the joint portion 221 of the waterproof component 220 and correspond in position to the through holes 211B of the supportive sheet metal 211, respectively. The positioning posts 221A pass through the through holes 211B, respectively. Therefore, the supportive sheet metal 211 and the waterproof component 220 position each other.

The movable latch lid 230 corresponds in shape to the supportive sheet metal 211 and thus is oblong. In this embodiment, the movable latch lid 230 is made of plastic to reduce the weight of the waterproof lid, but the present disclosure is not limited thereto. The movable latch lid 230 covers the other side of the supportive sheet metal 211 to thereby face away from the waterproof component 220. The upper and lower sides of the movable latch lid 230 each extend to form a shield 230A. The shields 230A shield and enclose the top edge and bottom edge of the waterproof component 220 and the supportive sheet metal 211, respectively. The movable latch lid 230 is penetrated by a plurality of passages 231 corresponding in position to the through holes 211B and the positioning posts 221A, respectively. In this embodiment, the passages 231 are counterbores, whereas the passages 231 extend in a direction parallel to the axle 211A, allowing the positioning posts 221A to abut against the passages 231 after passing through the through holes 211B, respectively.

The bolts 241 correspond in position to the passages 231 and the positioning posts 221A, respectively. The bolts 241 each comprise a rod portion 241A and a head portion 241B disposed at one end of the rod portion 241A. The other ends of the rod portions 241A pass through the passages 231 and the supportive sheet metal 211 so as to be fastened and fixed to the positioning posts 221A of the waterproof component 220, respectively. The head portions 241B stop at the outer side of the movable latch lid 230. Therefore, the waterproof component 220 and the movable latch lid 230 can be fixed together, and the movable latch lid 230 can move leftward and rightward relative to the supportive sheet metal 211, allowing the displacement of the movable latch lid 230 to be limited by the length of extension of the passages 231.

A handle 232 is protrudingly disposed on the outer side of the movable latch lid 230 and disposed between any two adjacent ones of the passages 231. In this embodiment, the handle 232 is slender and perpendicular to the direction of extension of the movable latch lid 230, such that users can easily push the handle 232 to trigger the leftward and rightward movement of the movable latch lid 230. Furthermore, at least a latch portion 233 is protrudingly disposed on the shield 230A lying above the movable latch lid 230. The opening 110 of the casing 100 has at least a fastening groove 111 corresponding in position to the latch portion 233. In this embodiment, both the latch portion 233 and the fastening groove 111 are in the number of three, whereas the latch portions 233 are each a bump, and the fastening grooves 111 each have a slot, but the present disclosure is not limited thereto.

Figure 3:
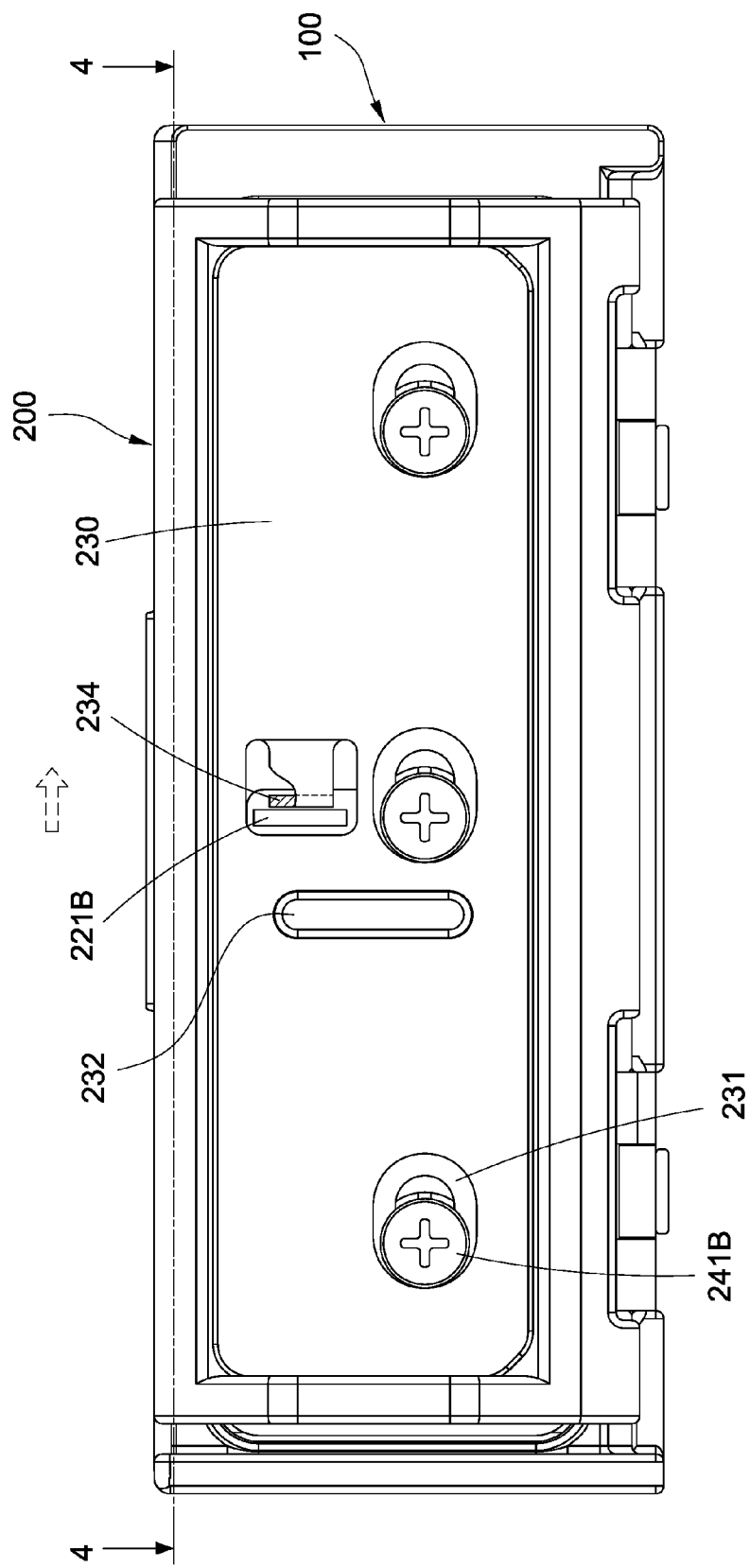
FIG. 3 is a front view of an aspect of the present disclosure.
Figure 4:
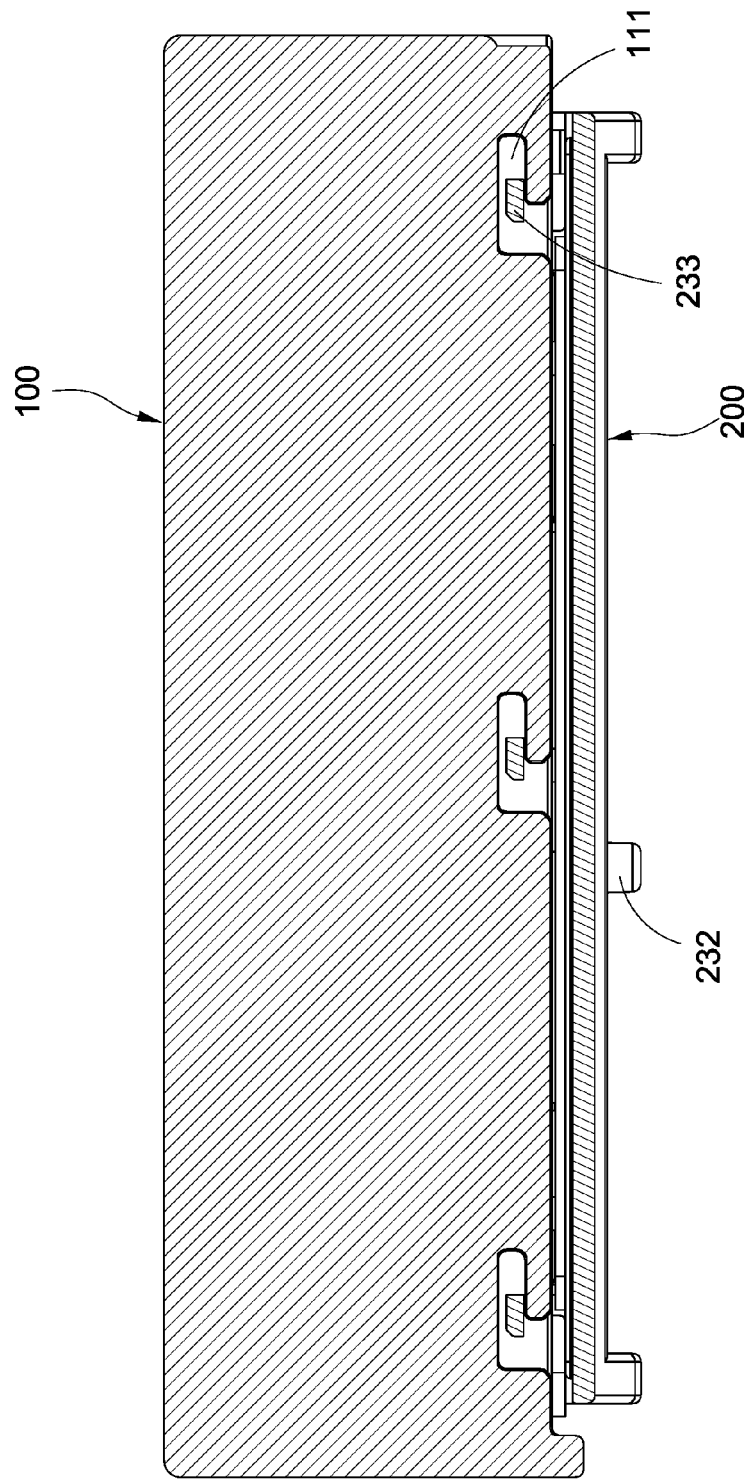
FIG. 4 is a cross-sectional top view taken along line 4-4 of FIG. 3.
Figure 5:
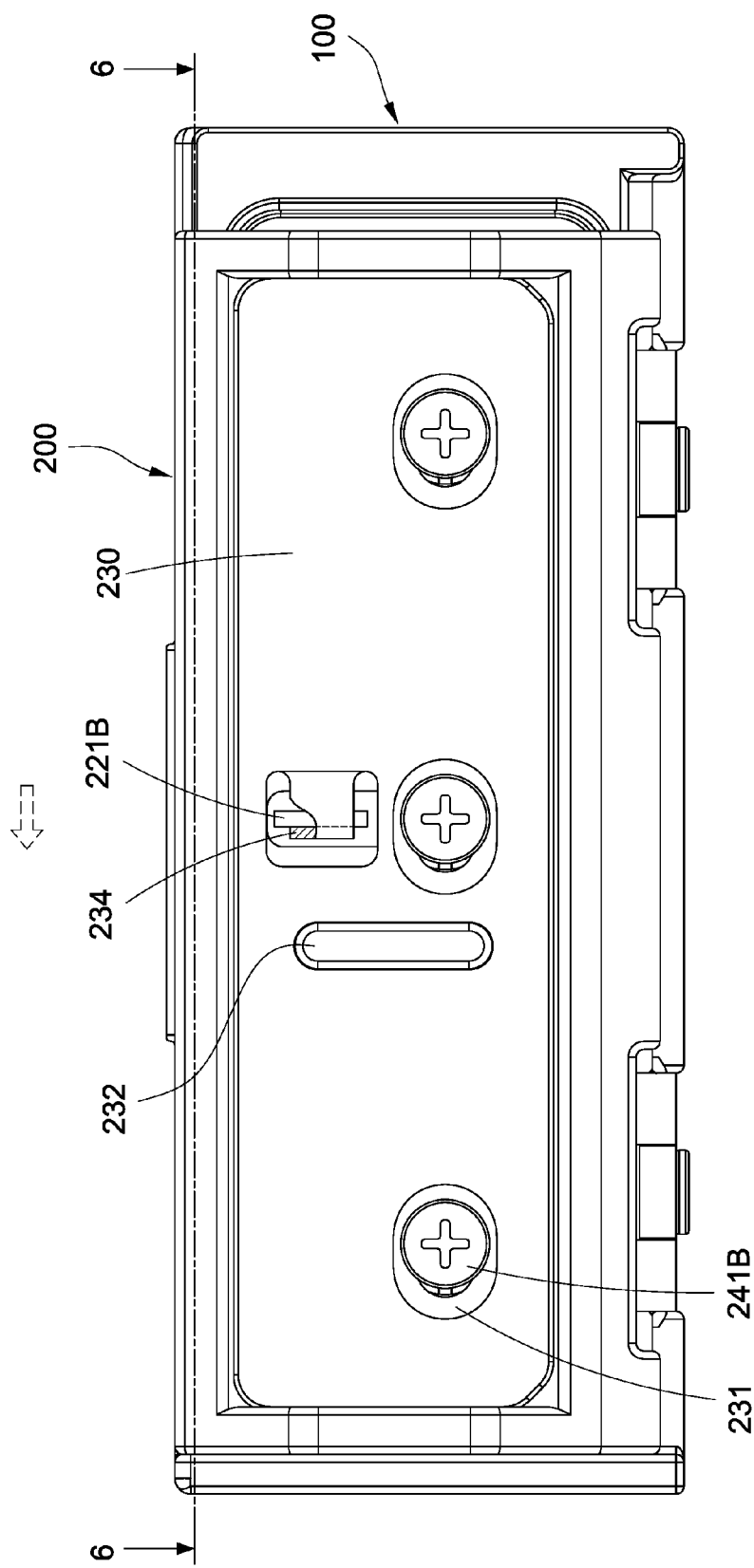
FIG. 5 is a front view of another aspect of the present disclosure.

Referring to FIG. 3 and FIG. 4, when users push the handle 232, the movable latch lid 230 moves along the direction of extension of the passages 231 to reach a fastening position, such that the latch portions 233 in the form of bumps are latched into the fastening grooves 111, so as to fix the waterproof lid structure 200 in place and prevent it from opening. Referring to FIG. 5 and FIG. 6, to open the waterproof lid structure 200, users push the handle 232 reversely, such that the movable latch lid 230 moves to an unlocked position, triggering the separation of the latch portions 233 from the slots of the fastening grooves 111. Therefore, the latch portions 233 and the fastening grooves 111 address the durability issue better than hook-based engagement in terms of the fixation of the waterproof lid structure 200. In addition, the waterproof lid structure 200 has the supportive sheet metal 211 and thus is structurally stronger than its conventional counterparts which are entirely made of plastic, and the waterproof lid structure 200 is not predisposed to damage and deformation even after long use.

In this embodiment, the bolts 241, the through holes 211B and the positioning posts 221A are each in the number of three, but the present disclosure is not limited thereto. For example, the bolts 241, the through holes 211B and the positioning posts 221A may each be in the number of two or four. The supportive sheet metal 211 further has a slot 211C. In this embodiment, the slot 211C lies above the middle one of the through holes 211B. A dowel 221B corresponding in position to the slot 211C is protrudingly disposed at the joint portion 221 of the waterproof component 220. The dowel 221B is penetratingly disposed at the slot 211C. A resilient hook 234 corresponding in position to the dowel 221B is disposed at the movable latch lid 230. The resilient hook 234 is engagingly fitted to the dowel 221B upon the axial movement of the movable latch lid 230. Referring to FIG. 3 and FIG. 5, users confirm whether the movable latch lid 230 has moved to a fastening position or a release position by observing variations in engagingly fitting the resilient hook 234 to the left and right sides of the dowel 221B.

Referring to FIG. 2, preferably, the waterproof lid structure 200 of the present disclosure further comprises a magnet 250 and a decorative plate 260. The joint portion 221 of the waterproof component 220 has a receiving chamber 221C. The supportive sheet metal 211 is penetrated by a magnet through-hole 211D. The magnet 250 is received in the receiving chamber 221C and penetrates the magnet through-hole 211D so as to be clamped by the movable latch lid 230. Therefore, the magnet 250 works along with a detector (not shown) disposed in the opening 110 to detect whether the waterproof lid structure 200 is opened or shut. The decorative plate 260 is a slender plastic plate penetrated by a handle through-hole 261. The decorative plate 260 is engagingly disposed on the outer side of the movable latch lid 230. The handle 232 is protruded from the handle through-hole 261 and exposed from the decorative plate 260. Therefore, the decorative plate 260 conceals the passages 231, bolts 241 and resilient hook 234 to ensure the neat, visually pleasing appearance of the waterproof lid structure 200. Moreover, the handle 232 protruding from the handle through-hole 261 is easy to push by users.

The present disclosure further provides a method of assembling an electronic device, as described below. The positioning posts 221A of the waterproof component 220 pass through the through holes 211B on the supportive sheet metal 211, respectively, such that the waterproof component 220 is disposed on one side of the supportive sheet metal 211. Then, the movable latch lid 230 covers the other side of the supportive sheet metal 211, such that the positioning posts 221A abuttingly fit to the passages 231 on the movable latch lid 230, respectively. Next, the rod portions 241A of the bolts 241 pass from the outer side of the movable latch lid 230 through the passages 231, respectively, and pass through the supportive sheet metal 211 before being fastened and fixed to the positioning posts 221A of the waterproof component 220, respectively, thereby allowing the head portion 241B to stop at the outer side of the movable latch lid 230 and fixing the movable latch lid 230 to the waterproof component 220. After that, the axle 211A of the supportive sheet metal 211 is pivotally connected to one side of the opening 110, and the waterproof lid structure 200 is shut to cause the seal portion 222 of the waterproof component 220 to cover and hermetically seal the opening 110. Finally, users push the handle 232 to drive the movable latch lid 230 to move to the fastening position and cause the resilient hook 234 to engagingly fit to the right side of the dowel 221B, thereby allowing the latch portions 233 to be latched into the fastening grooves 111 to fasten the movable latch lid 230 in place.

The present disclosure further provides an electronic device. Referring to FIG. 1 and FIG. 2, the electronic device essentially comprises a casing 100 and a waterproof lid structure 200.

In this embodiment, the casing 100 is made of aluminum or plastic, but the present disclosure is not limited thereto. The casing 100 has a chamber 100A for receiving a battery (not shown) and has an opening 110 in communication with the chamber 100A. In this embodiment, the opening 110 is oblong. The accompanying drawings show the opening 110 and its surroundings rather than the whole of the casing 100 for the sake of illustration, and the other parts of the casing 100 are not restrictive of the present disclosure.

The waterproof lid structure 200 corresponds in position to the opening 110 and looks like a door substantially. The waterproof lid structure 200 essentially comprises a base 210, a waterproof component 220, a movable latch lid 230 and a plurality of coupling elements 240.

The base 210 is penetrated by a plurality of through holes 211B and pivotally disposed on one side of the opening 110. In this embodiment, the base 210 comprises a supportive sheet metal 211 and two securing sheet metals 212. The supportive sheet metal 211 corresponds in shape to the opening 110 and is a slender sheet metal plate made of stainless steel, but the present disclosure is not limited thereto. For example, the supportive sheet metal 211 can be any other metal plate of high mechanical strength. The through holes 211B are disposed on the supportive sheet metal 211. The through holes 211B are equidistantly disposed along the longitudinal direction of the supportive sheet metal 211. The securing sheet metals 212 are fixed to one side of the opening 110 through two screwing elements A. The supportive sheet metal 211 is pivotally fitted to the securing sheet metals 212 and thus can turn over relative to the securing sheet metals 212.

The waterproof component 220 corresponds in shape to the supportive sheet metal 211 and thus is oblong. In this embodiment, the waterproof component 220 comprises a joint portion 221 and a seal portion 222 which are connected. The joint portion 221 is made of hard plastic. The seal portion 222 is made of soft plastic (for example, silica gel or rubber), and both are coupled together by bi-injection to manufacture the waterproof component 220. The joint portion 221 is disposed on one side of the supportive sheet metal 211 and corresponds in position to the opening 110. The seal portion 222 hermetically seals the opening 110. Therefore, the soft seal portion 222 hermetically seals the opening 110 effectively by resilient deformation to thereby attain a minimum waterproof and dustproof rating of IP66. The tolerance of the joint portion 221 made of plastic is effectively controlled during a production process to enable the joint portion 221 to snap-engage with the supportive sheet metal 211. A plurality of positioning posts 221A are protrudingly disposed at the joint portion 221 of the waterproof component 220 and correspond in position to the through holes 211B of the supportive sheet metal 211, respectively. The positioning posts 221A pass through the through holes 211B, respectively. Therefore, the supportive sheet metal 211 and the waterproof component 220 position each other.

The movable latch lid 230 corresponds in shape to the supportive sheet metal 211 and thus is oblong. In this embodiment, the movable latch lid 230 is made of plastic to reduce the weight of the waterproof lid, but the present disclosure is not limited thereto. The movable latch lid 230 covers the other side of the supportive sheet metal 211 to thereby face away from the waterproof component 220. The upper and lower sides of the movable latch lid 230 each extend to form a shield 230A. The shields 230A shield and enclose the top edge and bottom edge of the waterproof component 220 and the supportive sheet metal 211, respectively. The movable latch lid 230 is penetrated by a plurality of passages 231 corresponding in position to the through holes 211B and the positioning posts 221A, respectively. In this embodiment, the passages 231 are counterbores, whereas the passages 231 extend in a direction parallel to the axle 211A, allowing the positioning posts 221A to abut against the passages 231 after passing through the through holes 211B, respectively.

The coupling elements 240 correspond in position to the passages 231 and the positioning posts 221A, respectively. In this embodiment, the coupling elements 240 are step bolts. The coupling elements 240 each comprise a rod portion 241A and a head portion 241B disposed at one end of the rod portion 241A. The other ends of the rod portions 241A pass through the passages 231 and then pass through the through holes 211B of the supportive sheet metal 211 before being fastened to the positioning posts 221A of the waterproof component 220, respectively, allowing the head portions 241B to stop at the outer sides of the passages 231 of the movable latch lid 230, respectively. Therefore, the waterproof component 220 and the movable latch lid 230 are fixed together. Owing to the passages 231, it is feasible for the movable latch lid 230 to slide along the rod portion 241A and thus move leftward and rightward relative to the supportive sheet metal 211, and the displacement of the movable latch lid 230 is limited by the length of extension of the passages 231.

A handle 232 is protrudingly disposed on the outer side of the movable latch lid 230 and between any two adjacent ones of the passages 231. In this embodiment, the handle 232 is slender and perpendicular to the direction of extension of the movable latch lid 230 to render it easy for users to push the handle 232 and thereby trigger the leftward and rightward movement of the movable latch lid 230. At least a latch portion 233 is protrudingly disposed at the shield 230A lying above the movable latch lid 230, and at least a fastening groove 111 corresponding in position to the latch portion 233 is disposed at the opening 110 of the casing 100. In this embodiment, the latch portions 233 and the fastening grooves 111 are each in the number of three, whereas the latch portions 233 are each a bump, and the fastening grooves 111 each have a slot, but the present disclosure is not limited thereto.

Referring to FIG. 3 and FIG. 4, when users push the handle 232, the movable latch lid 230 moves along the direction of extension of the passages 231 to reach a fastening position, such that the latch portions 233 in the form of bumps are latched into the fastening grooves 111, so as to fix the waterproof lid structure 200 in place and prevent it from opening. Referring to FIG. 5 and FIG. 6, to open the waterproof lid structure 200, users push the handle 232 reversely, such that the movable latch lid 230 moves to an unlocked position, triggering the separation of the latch portions 233 from the slots of the fastening grooves 111. Therefore, the latch portions 233 and the fastening grooves 111 address the durability issue better than hook-based engagement in terms of the fixation of the waterproof lid structure 200. In addition, the waterproof lid structure 200 has the supportive sheet metal 211 and thus is structurally stronger than its conventional counterparts which are entirely made of plastic, and the waterproof lid structure 200 is not predisposed to damage and deformation even after long use.

In this embodiment, the coupling elements 240, through holes 211B and positioning posts 221A are in the number of three, respectively, but the present disclosure is not limited thereto. For example, the coupling elements 240, through holes 211B and positioning posts 221A may also be in the number of two or four, respectively. The supportive sheet metal 211 further has a slot 211C. In this embodiment, the slot 211C lies above the middle one of the through holes 211B. A dowel 221B corresponding in position to the slot 211C is protrudingly disposed at the joint portion 221 of the waterproof component 220. The dowel 221B is penetratingly disposed at the slot 211C. A resilient hook 234 corresponding in position to the dowel 221B is disposed at the movable latch lid 230. The resilient hook 234 is engagingly fitted to the dowel 221B upon the axial movement of the movable latch lid 230. Referring to FIG. 3 and FIG. 5, users confirm whether the movable latch lid 230 has moved to a fastening position or a release position by observing variations in engagingly fitting the resilient hook 234 to the left and right sides of the dowel 221B.

Referring to FIG. 2, preferably, the waterproof lid structure 200 of the present disclosure further comprises a magnet 250 and a decorative plate 260. A receiving chamber 221C is disposed at the joint portion 221 of the waterproof component 220. A magnet through-hole 211D is penetratingly disposed at the supportive sheet metal 211. The magnet 250 is received in the receiving chamber 221C and penetrates the magnet through-hole 211D so as to be held by the movable latch lid 230. Therefore, the magnet 250 works along with a detector (not shown) disposed in the opening 110 to detect whether the waterproof lid structure 200 is opened or shut. The decorative plate 260 is a slender plastic plate penetrated by a handle through-hole 261. The decorative plate 260 is engagingly disposed on the outer side of the movable latch lid 230. The handle 232 is protruded from the handle through-hole 261 and exposed from the decorative plate 260. Therefore, the decorative plate 260 conceals the passages 231, bolts 241 and resilient hook 234 to ensure the neat, visually pleasing appearance of the waterproof lid structure 200. Moreover, the handle 232 protruding from the handle through-hole 261 is easy to push by users.

A method of assembling an electronic device according to the present disclosure is described below. The positioning posts 221A of the waterproof component 220 pass through the through holes 211B on the supportive sheet metal 211 of the base 210, respectively, to position the waterproof component 220 on one side of the supportive sheet metal 211. Then, the movable latch lid 230 covers the other side of the supportive sheet metal 211 to allow the positioning posts 221A to abuttingly fit to the passages 231 on the movable latch lid 230, respectively. Next, the rod portions 241A of the coupling elements 240 pass from the outer side of the movable latch lid 230 through the passages 231 and then through the through holes 211B of the supportive sheet metal 211 before being fastened and fixed to the positioning posts 221A of the waterproof component 220, respectively, so as for the head portions 241B to stop at the outer side of the movable latch lid 230, for the movable latch lid 230 to be fixed to the waterproof component 220, and for the movable latch lid 230 to slide relative to the rod portions 241A through the passages 231. After that, the securing sheet metals 212 of the base 210 are fixed to one side of the opening 110 to allow the supportive sheet metal 211 to rotate relative to the securing sheet metals 212, and the waterproof lid structure 200 is shut to allow the seal portion 222 of the waterproof component 220 to cover and hermetically seal the opening 110. Finally, users push the handle 232 to drive the movable latch lid 230 to move along the direction of extension of the passages 231 to thereby reach a fastening position and cause the resilient hook 234 to engagingly fit to the right side of the dowel 221B, allowing the latch portions 233 to be latched into the fastening grooves 111 to thereby fasten the movable latch lid 230 in place.

In conclusion, the present disclosure meets the three requirements of patentability, namely industrial applicability, novelty and non-obviousness. Persons skilled in the art can make various changes and variations to the embodiments of the present disclosure without departing from the spirit and essence of the present disclosure. The changes and variations shall be deemed falling within the scope of the claims of the present disclosure.

What is claimed is:

1. An electronic device, comprising:
   a casing having an opening;
   a waterproof lid structure corresponding in position to the opening and comprising:
   a supportive sheet metal having an axle, with the axle pivotally connected to a side of the opening;
   a waterproof component for hermetically sealing the opening, with the waterproof component disposed on a side of the supportive sheet metal and corresponding in position to the opening;
   a movable latch lid for covering another side of the supportive sheet metal, with the movable latch lid penetrated by a plurality of passages; and
   a plurality of bolts corresponding in position to the passages, respectively, the bolts each comprising a rod portion and a head portion disposed at an end of the rod portion, wherein the rod portions pass through the passages and the supportive sheet metal, respectively, and another end of each said rod portion is fastened to the waterproof component, allowing the head portion to stop at an outer side of the movable latch lid.

2. The electronic device of claim 1, wherein the passages extend in a direction parallel to the axle.

3. The electronic device of claim 2, wherein a handle is protrudingly disposed on an outer side of the movable latch lid, whereas a latch portion is disposed on an inner side of the movable latch lid, wherein the opening has a fastening groove corresponding in position to the latch portion, such that the handle can be pushed to cause the movable latch lid to move along the direction of extension of the passages to a fastening position, allowing the latch portion to be latched into the fastening groove, and allowing the displacement of the movable latch lid to be limited by the length of extension of the passages.

4. The electronic device of claim 3, wherein the supportive sheet metal has a slot, whereas a dowel corresponding in position to the slot is protrudingly disposed at the waterproof component and penetratingly disposed at the slot, wherein the movable latch lid has a resilient hook corresponding in position to the dowel, with the resilient hook adapted to be engagedly fitted to the dowel upon axial movement of the movable latch lid.

5. The electronic device of claim 1, wherein a plurality of positioning posts are protrudingly disposed on a side of the waterproof component and positioned proximate to the supportive sheet metal, and the supportive sheet metal has a plurality of through holes corresponding in position to the positioning posts, respectively, wherein the positioning posts pass through the through holes and thereby abuttingly fit to the movable latch lid.

6. The electronic device of claim 5, wherein the positioning posts correspond in position to the bolts, respectively, and the bolts are fastened to the positioning posts, respectively.

7. A method of assembling an electronic device, comprising the steps of:
   a) providing a casing, a supportive sheet metal, a waterproof component, a movable latch lid and a plurality of bolts, the casing having an opening, the supportive sheet metal having an axle, the movable latch lid being penetrated by a plurality of passages, the bolts corresponding in position to the passages, respectively, the bolts each comprising a rod portion and a head portion disposed at an end of the rod portion;
   b) positioning the waterproof component on a side of the supportive sheet metal and covering another side of the supportive sheet metal with the movable latch lid;
   c) passing the rod portions of the bolts from an outer side of the movable latch lid through the passages, respectively, and through the supportive sheet metal before being fastened to the waterproof component, thereby allowing the head portion to stop at the outer side of the movable latch lid; and
   d) connecting pivotally the axle of the supportive sheet metal to a side of the opening,
   wherein the waterproof component covers and hermetically seals the opening.

8. The method of claim 7, wherein a latch portion is disposed on an inner side of the movable latch lid, and the opening has a fastening groove corresponding in position to the latch portion, allowing the movable latch lid to move along the direction of extension of the passages, and allowing the latch portion to be latched into the fastening groove to thereby fastening the movable latch lid in place.

9. The method of claim 8, wherein the supportive sheet metal has a slot, whereas a dowel corresponding in position to the slot is protrudingly disposed at the waterproof component and penetratingly disposed at the slot, wherein the movable latch lid has a resilient hook corresponding in position to the dowel, with the resilient hook adapted to be engagedly fitted to the dowel upon axial movement of the movable latch lid.

10. The method of claim 7, wherein a plurality of positioning posts are protrudingly disposed on a side of the waterproof component and positioned proximate to the supportive sheet metal, and the supportive sheet metal has a plurality of through holes corresponding in position to the positioning posts, respectively, wherein the method further comprises the step of allowing the positioning posts to pass through the through holes and thereby abuttingly fit to the movable latch lid.

11. The method of claim 10, wherein the positioning posts correspond in position to the bolts, respectively, and the method further comprises the step of fastening the bolts to the positioning posts, respectively.

12. An electronic device, comprising:
a casing having an opening;
a waterproof lid structure corresponding in position to the opening and comprising:
a base penetrated by a through hole and pivotally disposed on a side of the opening, wherein the base comprises a supportive sheet metal having an axle;
a waterproof component disposed on a side of the base to hermetically seal the opening;
a movable latch lid penetrated by a passage and disposed on another side of the base; and
a coupling element comprising a rod portion and a head portion disposed at an end of the rod portion, the rod portion passing through the passage and then passing through the through hole, the head portion stopping at an outer side of the passage, wherein another end of the rod portion is fixed to the waterproof component, and the movable latch lid slides along the rod portion through the passage.

13. The electronic device of claim 12, wherein the coupling element is a step bolt.

14. The electronic device of claim 12, wherein the base further comprises a securing sheet metal, the supportive sheet metal being penetrated by the through hole, and the securing sheet metal being fixed to a side of the opening, wherein the supportive sheet metal is pivotally connected to the securing sheet metal.

15. A method of assembling an electronic device, comprising the steps of:
a) providing a casing, a base, a waterproof component, a movable latch lid and a coupling element, the casing having an opening, the base being penetrated by a through hole, the movable latch lid being penetrated by a passage, and the coupling element comprising a rod portion and a head portion disposed at an end of the rod portion, wherein the base comprises a supportive sheet metal having an axle;
b) positioning the waterproof component on a side of the base and positioning the movable latch lid on another side of the base;
c) passing the rod portion through the passage and then through the through hole, allowing the head portion to stop at an outer side of the passage, allowing another end of the rod portion to be fixed to the waterproof component, allowing the movable latch lid to slide along the rod portion through the passage; and
d) connecting pivotally the base to a side of the opening.

16. The method of claim 15, wherein a latch portion is disposed on an inner side of the movable latch lid, and the opening has a fastening groove corresponding in position to the latch portion, moving the movable latch lid along the direction of extension of the passage, allowing the latch portion to be latched into the fastening groove, thereby fastening the movable latch lid in place.

\* \* \* \* \*